(12) United States Patent
Hook et al.

(10) Patent No.: US 11,101,367 B2
(45) Date of Patent: Aug. 24, 2021

(54) CONTACT-FIRST FIELD-EFFECT TRANSISTORS

(71) Applicant: International Business Machines Corporation, Armonk, NY (US)

(72) Inventors: Terence B. Hook, Jericho, VT (US); Myung-Hee Na, Lagrangeville, NY (US); Balasubramanian Pranatharthiharan, Watervliet, NY (US); Andreas Scholze, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/670,894

(22) Filed: Oct. 31, 2019

(65) Prior Publication Data

US 2020/0066871 A1 Feb. 27, 2020

Related U.S. Application Data

(62) Division of application No. 14/744,147, filed on Jun. 19, 2015, now abandoned.

(51) Int. Cl.

| H01L 21/225 | (2006.01) |
|---|---|
| H01L 29/66 | (2006.01) |
| H01L 29/417 | (2006.01) |
| H01L 29/08 | (2006.01) |
| H01L 29/423 | (2006.01) |
| H01L 29/78 | (2006.01) |

(52) U.S. Cl.
CPC ...... *H01L 29/6656* (2013.01); *H01L 21/2254* (2013.01); *H01L 29/0847* (2013.01); *H01L 29/41791* (2013.01); *H01L 29/4238* (2013.01); *H01L 29/6653* (2013.01); *H01L 29/66795* (2013.01); *H01L 29/785* (2013.01)

(58) Field of Classification Search
CPC .............. H01L 29/6656; H01L 29/785; H01L 29/4238; H01L 29/66795; H01L 21/2254; H01L 29/6653; H01L 29/41791; H01L 29/0847

See application file for complete search history.

(56) References Cited

U.S. PATENT DOCUMENTS

| 5,545,579 | A | 8/1996 | Liang et al. |
|---|---|---|---|
| 5,856,225 | A | 1/1999 | Lee et al. |
| 5,960,270 | A | 9/1999 | Misra et al. |
| 5,989,966 | A | 11/1999 | Huang |
| 6,160,299 | A | 12/2000 | Radder |
| 6,372,589 | B1 | 4/2002 | Yu |

(Continued)

OTHER PUBLICATIONS

List of IBM Patents or Patent Applications Treated as Related; Hook, T,B. et al., U.S. Appl. No. 14/744,147, filed Jun. 19, 2015.

*Primary Examiner* — Jarrett J Stark
(74) *Attorney, Agent, or Firm* — Sherman IP LLP; Kenneth L. Sherman; Hemavathy Perumal

(57) ABSTRACT

A method for forming a device structure provides for forming a fin of a semiconductor material. A first contact is formed on the fin. A second contact is formed on the fin and spaced along a length of the fin from the first contact. A self-aligned gate electrode is formed on the fin that is positioned along the length of the fin between the first contact and the second contact.

20 Claims, 6 Drawing Sheets

(56) References Cited

U.S. PATENT DOCUMENTS

| | | | |
|---|---|---|---|
| 6,642,119 B1 * | 11/2003 | Pelella | H01L 21/84 |
| | | | 257/E21.413 |
| 6,787,424 B1 | 9/2004 | Yu | |
| 7,223,650 B2 | 5/2007 | Chang | |
| 7,488,650 B2 | 2/2009 | Schulz | |
| 7,566,599 B2 | 7/2009 | Divakaruni et al. | |
| 8,216,902 B2 * | 7/2012 | Chang | H01L 27/1104 |
| | | | 438/275 |
| 8,241,939 B2 * | 8/2012 | Park | B82Y 10/00 |
| | | | 438/48 |
| 8,399,330 B2 * | 3/2013 | Liu | H01L 29/775 |
| | | | 438/311 |
| 8,422,273 B2 * | 4/2013 | Chang | B82Y 10/00 |
| | | | 365/151 |
| 8,441,043 B2 * | 5/2013 | Bangsaruntip | H01L 29/0665 |
| | | | 257/213 |
| 8,551,833 B2 * | 10/2013 | Chang | H01L 29/42392 |
| | | | 438/199 |
| 8,558,219 B2 * | 10/2013 | Bangsaruntip | H01L 29/66439 |
| | | | 257/29 |
| 8,778,768 B1 * | 7/2014 | Chang | H01L 29/78696 |
| | | | 438/303 |
| 8,901,655 B2 * | 12/2014 | Chang | H01L 29/66772 |
| | | | 257/347 |
| 8,912,609 B2 * | 12/2014 | Basu | H01L 29/6653 |
| | | | 257/401 |
| 8,928,083 B2 * | 1/2015 | Chang | H01L 21/845 |
| | | | 257/350 |
| 8,946,789 B2 * | 2/2015 | Kim | B82Y 40/00 |
| | | | 257/288 |
| 8,994,108 B2 * | 3/2015 | Chang | H01L 29/42392 |
| | | | 257/347 |
| 9,029,834 B2 * | 5/2015 | Bangsaruntip | H01L 29/165 |
| | | | 257/24 |
| 9,048,262 B2 * | 6/2015 | Adam | H01L 29/0847 |
| 9,252,017 B2 * | 2/2016 | Cheng | H01L 29/78696 |
| 9,390,932 B2 * | 7/2016 | Romero | H01L 21/28556 |
| 9,431,301 B1 * | 8/2016 | Chu | H01L 29/6656 |
| 9,590,089 B2 * | 3/2017 | Rachmady | H01L 29/66795 |
| 9,704,863 B1 * | 7/2017 | Cheng | H01L 21/823807 |
| 9,853,101 B2 * | 12/2017 | Peng | H01L 29/0649 |
| 9,917,240 B2 * | 3/2018 | Kim | H01L 27/16 |
| 9,972,542 B1 * | 5/2018 | Bi | H01L 21/02532 |
| 10,069,015 B2 * | 9/2018 | Cheng | H01L 29/0649 |
| 10,074,730 B2 * | 9/2018 | Bergendahl | H01L 29/0673 |
| 10,134,905 B2 * | 11/2018 | Guillorn | H01L 21/76889 |
| 10,177,226 B2 * | 1/2019 | Guillorn | H01L 29/78654 |
| 10,185,798 B2 * | 1/2019 | Kim | H01L 29/42392 |
| 10,490,559 B1 * | 11/2019 | Ando | H01L 29/401 |
| 10,546,926 B2 * | 1/2020 | Cheng | H01L 29/66742 |
| 2004/0092060 A1 | 5/2004 | Gambino et al. | |
| 2005/0202618 A1 | 9/2005 | Yagishita | |
| 2006/0091481 A1 * | 5/2006 | Li | H01L 29/1029 |
| | | | 257/401 |
| 2006/0197111 A1 | 9/2006 | Matsuzawa | |
| 2006/0216897 A1 * | 9/2006 | Lee | B82Y 10/00 |
| | | | 438/282 |
| 2007/0004124 A1 * | 1/2007 | Suk | H01L 29/42392 |
| | | | 438/238 |
| 2007/0017439 A1 * | 1/2007 | Xianyu | C30B 29/08 |
| | | | 117/108 |
| 2008/0099849 A1 * | 5/2008 | Kim | H01L 29/42392 |
| | | | 257/365 |
| 2008/0102586 A1 * | 5/2008 | Park | H01L 21/823807 |
| | | | 438/290 |
| 2008/0251779 A1 | 10/2008 | Kakoschke et al. | |
| 2013/0020613 A1 | 1/2013 | Mieno | |
| 2013/0134522 A1 | 5/2013 | Bhuwalka | |
| 2013/0187229 A1 | 7/2013 | Cheng et al. | |
| 2014/0001569 A1 | 1/2014 | Hafez et al. | |
| 2014/0110755 A1 | 4/2014 | Colinge | |
| 2014/0154846 A1 | 6/2014 | Cheng et al. | |
| 2015/0243769 A1 | 8/2015 | Goto et al. | |
| 2016/0093692 A1 | 3/2016 | Xie et al. | |

* cited by examiner

CONTACT-FIRST FIELD-EFFECT TRANSISTORS

BACKGROUND

The present invention relates to semiconductor device fabrication and, more specifically, to device structures for fin-type field-effect transistor (FinFET) integrated circuit technologies, as well as methods of fabricating device structures in FinFET integrated circuit technologies.

FinFETs are non-planar devices that are capable of being more densely packed in an integrated circuit than planar complementary metal-oxide-semiconductor (CMOS) transistors. In addition to the increase in packing density, FinFETs also offer superior short channel scalability, reduced threshold voltage swing, higher mobility, and the ability to operate at lower supply voltages than traditional planar CMOS transistors. Each FinFET features a narrow vertical fin of semiconductor material and a gate electrode that intersects a central channel of the fin. A thin gate dielectric layer separates the gate electrode from the fin. Heavily-doped source and drain regions are formed at opposite ends of the fin and the central channel is located between the source and drain regions.

Improved device structures and fabrication methods are needed for FinFET integrated circuit technologies.

SUMMARY

According to one embodiment, a method for forming a device structure provides for forming a fin of a semiconductor material. A first contact is formed on the fin. A second contact is formed on the fin and spaced along a length of the fin from the first contact. A self-aligned gate electrode is formed on the fin that is positioned along the length of the fin between the first contact and the second contact.

According to another embodiment, a method for forming a fin-type field effect transistor device structure provides for forming a fin comprised of a semiconductor material. A first contact is formed that partially wraps around a first end of the fin. A second contact is formed that partially wraps around a second end of the fin and spaced along a length of the fin from the first contact. A self-aligned gate electrode is formed on the fin that is positioned along the length of the fin between the first contact and the second contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
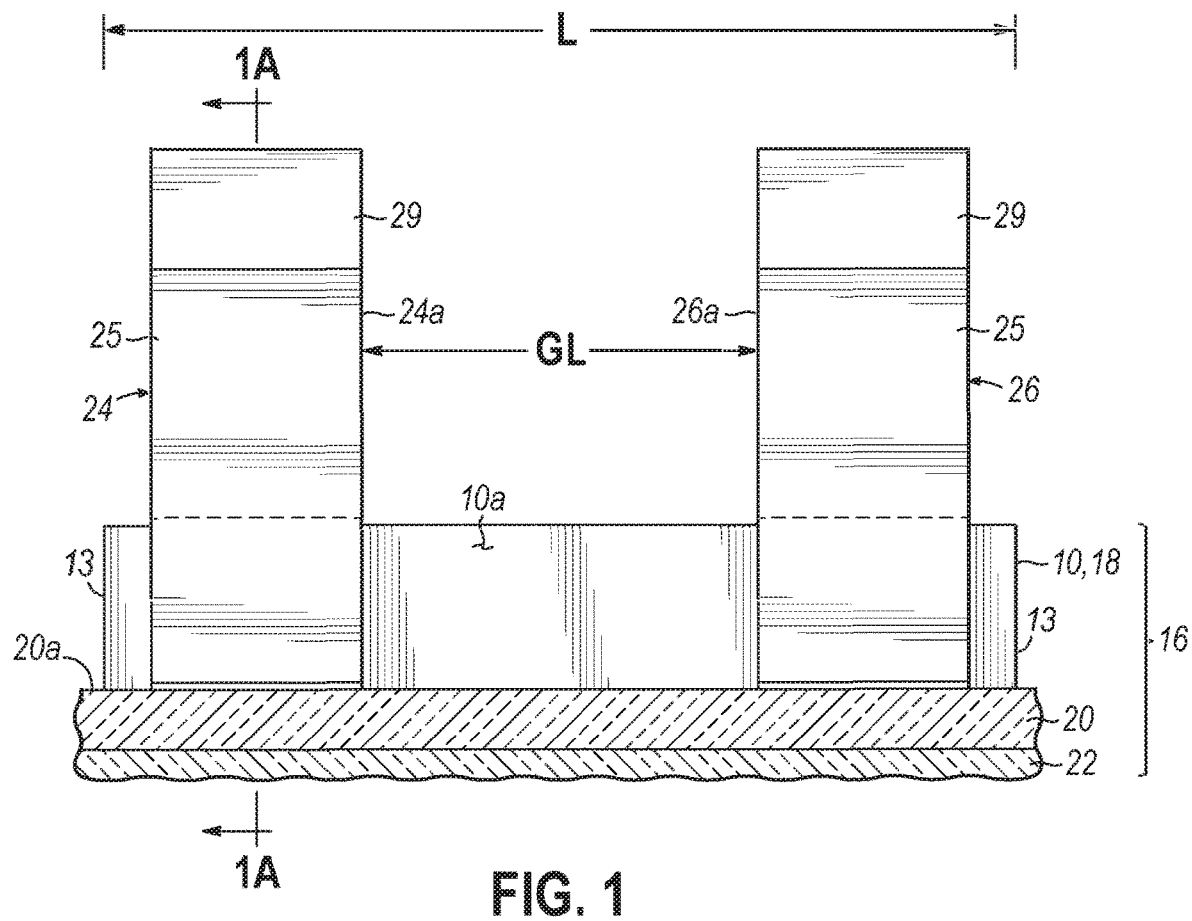
FIGS. 1-6 are side views of a portion of a substrate at successive fabrication stages of a processing method for forming a device structure from fins in accordance with an embodiment of the invention.
Figure 1A:
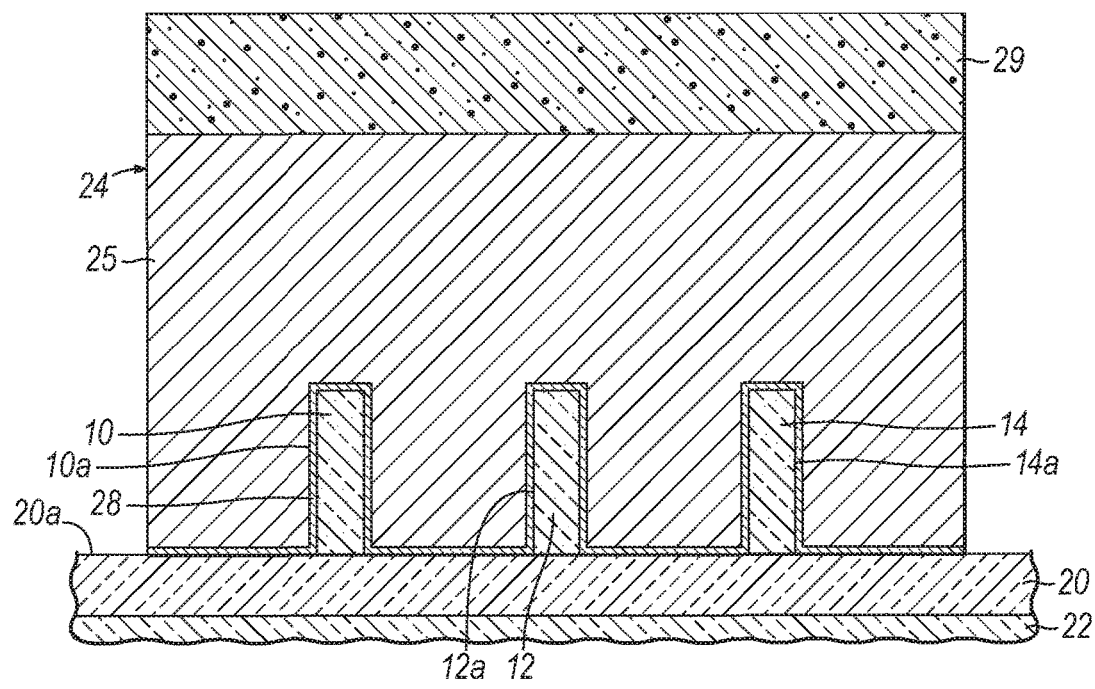
FIG. 1A is a cross-sectional view taken generally along line 1A-1A in FIG. 1.

With reference to FIGS. 1, 1A and in accordance with an embodiment of the invention, a plurality of fins 10, 12, 14 are formed from the device layer 18 of a semiconductor-on-insulator (SOI) substrate 16. The SOI substrate 16 further includes a buried insulator layer 20 comprised of an electrical insulator and a handle wafer 22. The device layer 18 is separated from the handle wafer 22 by the intervening buried insulator layer 20 and is in direct contact along a planar interface with a top surface 20a of the buried insulator layer 20. The buried insulator layer 20 electrically isolates the handle wafer 22 from the device layer 18, which is considerably thinner than the handle wafer 22. The device layer 18 and the handle wafer 22 may be comprised of a semiconductor material, such as single crystal silicon, and the semiconductor material of the device layer 18 may be device quality. The buried insulator layer 20 may be a buried oxide layer comprised of silicon dioxide ($SiO_2$).

Each of fins 10, 12, 14 is defined by a three-dimensional body of semiconductor material originating from the device layer 18. The fins 10, 12, 14 are positioned on the top surface 20a adjacent to each other, are laterally spaced apart across the top surface 20a, and may be aligned parallel with each other with a length L. Each of the fins 10, 12, 14 may have a bottom surface that is in direct contact with the top surface 20a of the buried insulator layer 20 along the interface between the device layer 18 and the buried insulator layer 20.

The fins 10, 12, 14 may be formed by photolithography and subtractive etching processes. To that end, the fins 10, 12, 14 may be formed, for example, using a sidewall image transfer (SIT) process that promotes dense packing. To that end, a cap layer and a sacrificial layer comprised of, for example, polysilicon may be serially deposited on the top surface of the device layer 18 and the sacrificial layer patterned to define mandrels in the region of the device layer 18 used to form the fins 10, 12, 14. Spacers are then formed on the sidewalls of the mandrels. The mandrels are arranged such that the spacers are formed at the intended locations for the fins 10, 12, 14. The mandrels are then selectively removed relative to the spacers using an etching process, such as RIE. The cap layer and the device layer 18 are patterned with an etching process, such as RIE, using one or more etching chemistries while each spacer operates as an individual etch mask for one of the fins 10, 12, 14. The etching process may stop on a top surface 20a of the buried insulator layer 20. The spacers and cap layer may be removed subsequent to the etching process so that the sidewalls of the fins 10, 12, 14 are exposed.

In an alternative embodiment, the fins 10, 12, 14 may be formed from a bulk substrate (i.e., a non-SOI substrate) in a bulk process flow. The subsequent fabrication stages for fins 10, 12, 14 formed using the device layer 18 of the SOI substrate 16 apply equally to the bulk substrate in this alternative embodiment.

Following the formation of the fins 10, 12, 14, contacts 24, 26 may be formed that partially wrap around the opposite ends of the fins 10, 12, 14 and that cover respective portions of their exterior surfaces 10a, 12a, 14a. The contacts 24, 26 are also in direct contact with the top surface 20a of the buried insulator layer 20. The contacts 24, 26 are electrically and physically coupled with the fins 10, 12, 14. The gap between the confronting sidewalls or side surfaces 24a, 26a of the contacts 24, 26 defines a space in which the gate electrode of the device structure is subsequently formed and defines the physical gate length GL of the device structure. The portions of the fins 10, 12, 14 that are contacted by the contacts 24, 26 comprise source/drain regions 13 of the device structure 50.

The contacts 24, 26 may be comprised of a conductor layer 25 and a liner layer 28. The liner layer 28 is positioned between the conductor layer 25 and the respective exterior surfaces 10a, 12a, 14a of the fins 10, 12, 14. The conductor layer 25 may be comprised of a metal, such as tungsten (W), that is deposited by, for example, physical vapor deposition (PVD). The liner layer 28 may be comprised of a metal, such as titanium (Ti) or tantalum (Ta), that is deposited by, for example, chemical vapor deposition (CVD).

The conductor layer 25 and liner layer 28 are subsequently patterned to form contacts 24, 26. To that end, a mask layer 29 may be applied on a top surface of the metal layers and patterned with photolithography. The mask layer 29 may comprise a light-sensitive material, such as a photoresist, that is applied by a spin coating process, pre-baked, exposed to light projected through a photomask, baked after exposure, and developed with a chemical developer to define an etch mask. Sections of the mask layer 29 cover the metal layer at the intended locations of the contacts 24, 26.

An etching process is then used, with the mask layer 29 present, to pattern the conductor layer 25 and liner layer 28. The conductor layer 25 and liner layer 28 may be patterned at a gate pitch when forming the contacts 24, 26. The etching process may be selected to remove the material of the conductor layer 25 and liner layer 28 selective to the semiconductor material of the fins 10, 12, 14. As used herein, the term "selective" in reference to a material removal process (e.g., etching) denotes that, with an appropriate etchant choice, the material removal rate for the targeted material is greater than the removal rate for at least another material exposed to the material removal process. The etching process may be conducted in a single etching step or multiple steps, and may rely on one or more etch chemistries.

The mask layer 29 may be removed following the conclusion of the etching process. If comprised of a photoresist, the mask layer 29 may be removed by ashing or solvent stripping, followed by a cleaning process.

In an alternative embodiment, the metal forming the contacts 24, 26 may be doped during deposition in order to provide a solid-state diffusion source for doping the fins 10, 12, 14 and/or to improve the contact resistance. The liner layer 28 may function as part of the contacts 24, 26 to reduce the contact resistance with the fins 10, 12, 14. In an alternative embodiment, the liner layer 28 may be omitted from the construction of the device structure.

Figure 2:
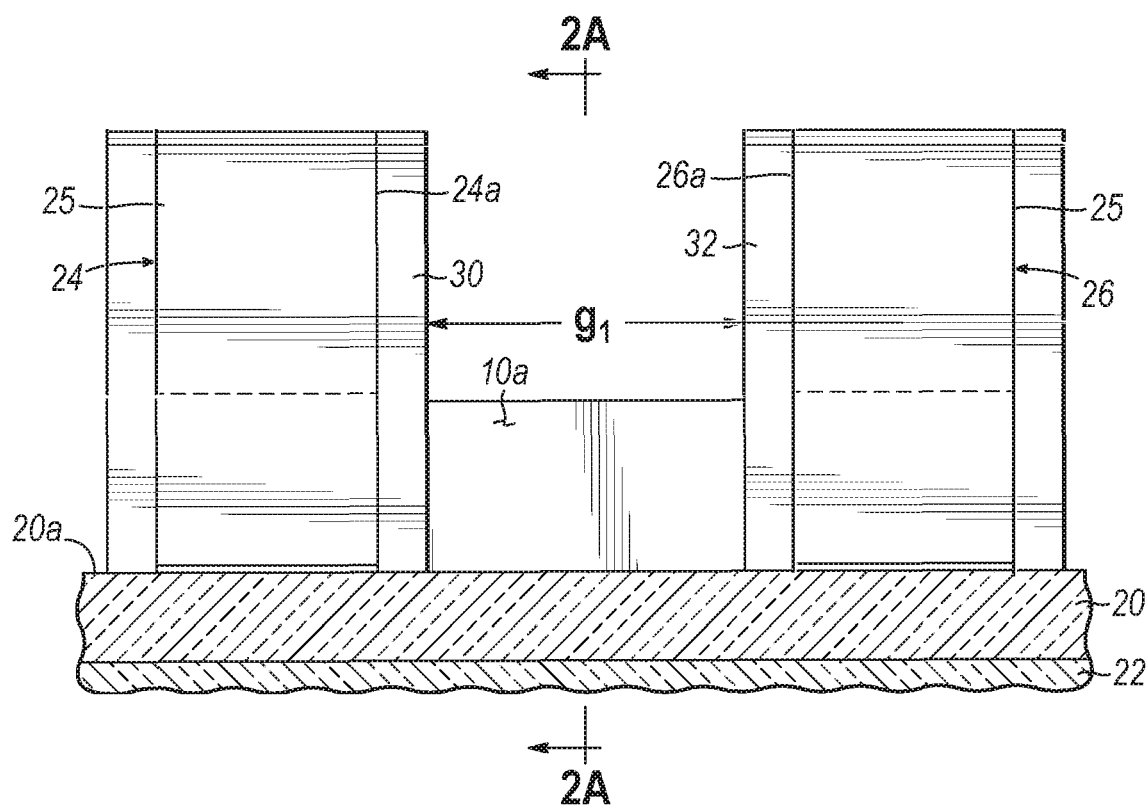
Figure 2A:
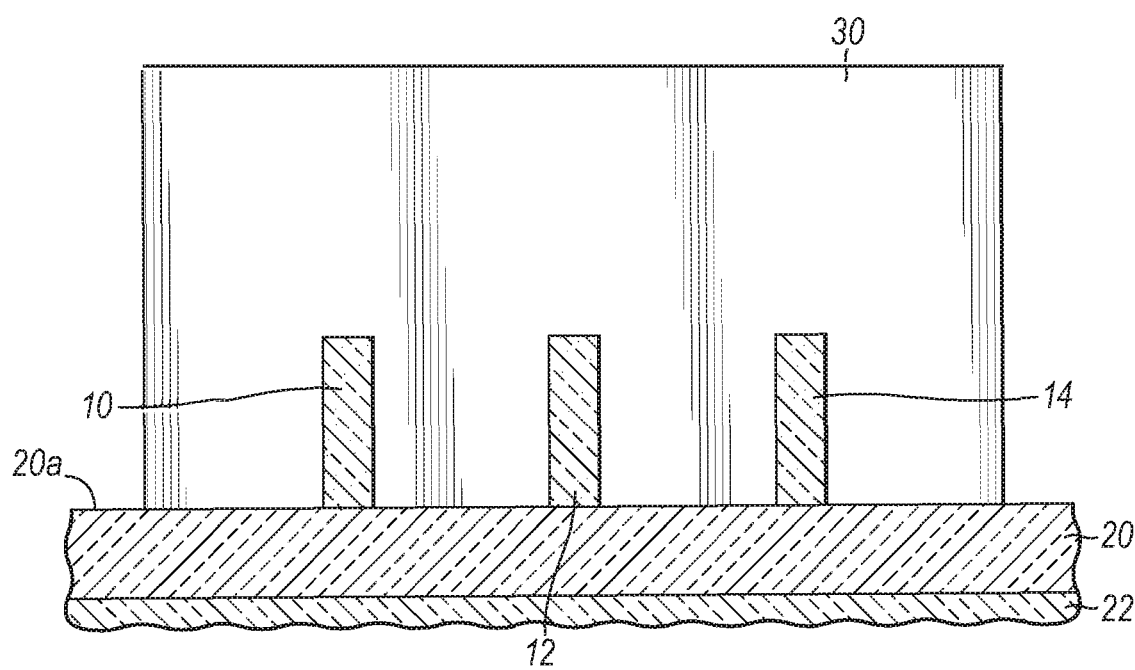
FIG. 2A is a cross-sectional view taken generally along line 2A-2A in FIG. 2.

With reference to FIGS. 2, 2A in which like reference numerals refer to like features in FIGS. 1, 1A and at a subsequent fabrication stage, spacers 30, 32 are formed on the side surfaces 24a, 26a of the contacts 24, 26. The spacers 30, 32 may be formed by depositing a conformal layer comprised of an electrical insulator and shaping the conformal layer with an anisotropic etching process, such as a RIE process, that preferentially removes the conformal layer from horizontal surfaces. At the conclusion of the anisotropic etching process, the spacers 30, 32 constitute residual shapes of electrical insulator residing on the vertical surfaces represented by the side surfaces 24a, 26a. The spacers 30, 32 may be comprised of, for example, silicon nitride ($Sh N_4$) or silicon dioxide deposited by chemical vapor deposition. The spacers 30, 32 are separated by gap $g_1$, which is less than the physical gate length GL of the device structure between the contacts 24, 26 by the spacer thickness.

In an alternative embodiment, the spacers 30, 32 on the side surfaces 24a, 26a of the contacts 24, 26 may be comprised of a material, such as a phosphorous-doped silicate glass (PSG), an arsenic-doped silicate glass (ASG), or a boron-doped silicate glass (BSG), that contains a dopant. Dopant originating from the solid-state dopant source represented by the spacers 30, 32 can be caused to diffuse locally from the spacers 30, 32 into the fins 10, 12, 14 by, for example, a thermal anneal process at a given temperature and over a given duration. These doped portions of the fins 10, 12, 14 may function to provide link-up extensions in the constituent semiconductor material between the source/drain regions 13 and channel of the device structure at locations beneath the spacers 30, 32.

Figure 3:
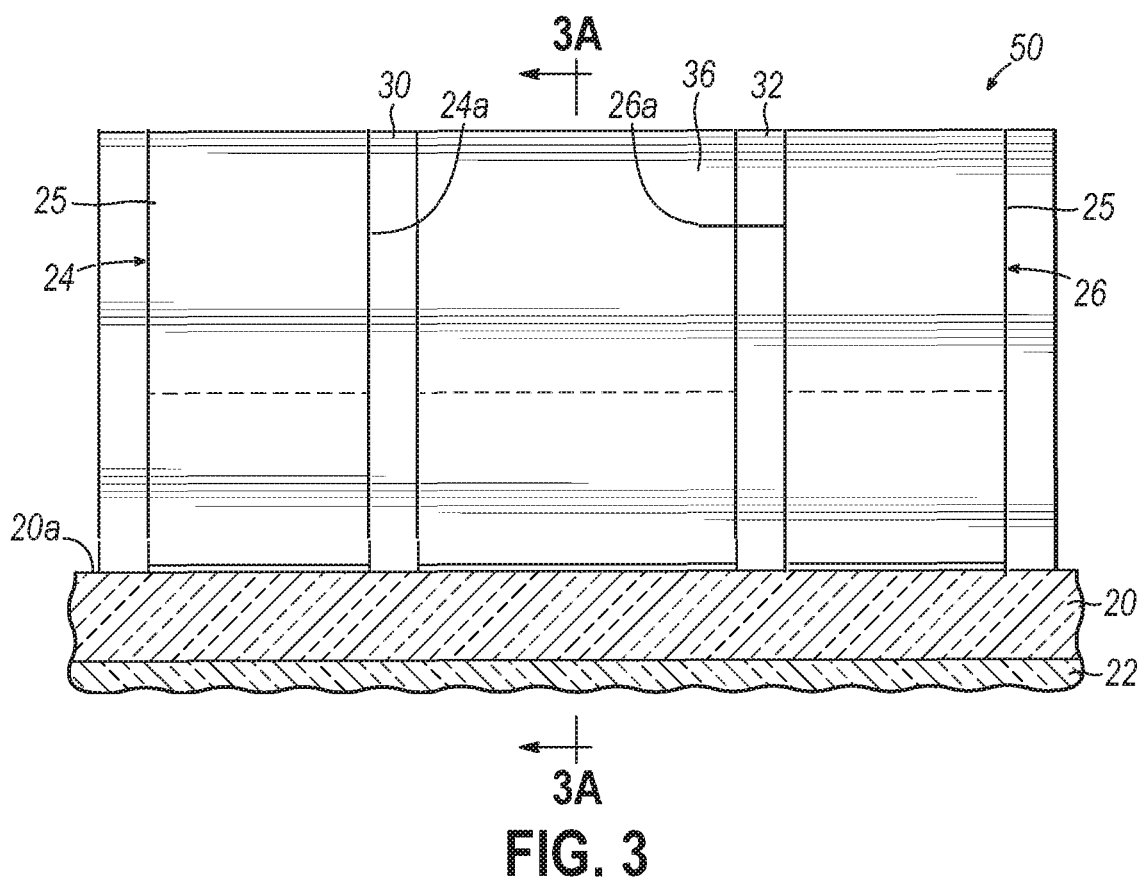
Figure 3A:
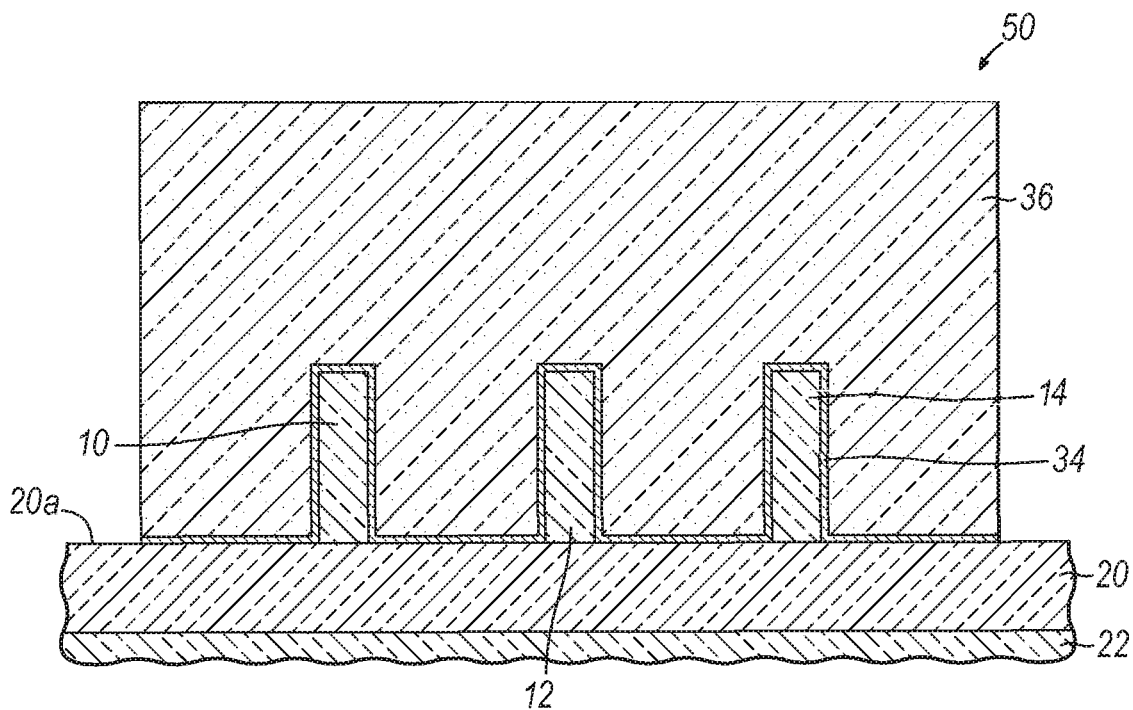
FIG. 3A is a cross-sectional view taken generally along line 3A-3A in FIG. 3.

With reference to FIGS. 3, 3A in which like reference numerals refer to like features in FIGS. 2, 2A and at a subsequent fabrication stage, a gate dielectric 34 and a gate electrode 36 are formed on the fins 10, 12, 14 over their respective exterior surfaces 10a, 12a, 14a. The gate dielectric 34 and gate electrode 36 are located in the gap g1 between the spacers 30, 32, and cover that respective portion of the exterior surfaces 10a, 12a, 14a. The portion of the fins 10, 12, 14 covered by the gate electrode 36 may define a channel of the device structure.

The gate dielectric 34 may be comprised of an electrical insulator with a dielectric constant (e.g., a permittivity) characteristic of a dielectric material. For example, the gate dielectric 34 may be comprised of silicon dioxide, silicon oxynitride, a high-k dielectric material such as hafnium oxide, or layered combinations of these dielectric materials, deposited by v, atomic layer deposition (ALD), etc. The gate electrode 36 is comprised of a metal, a silicide, polycrystalline silicon (e.g., polysilicon), or a combination of these materials deposited by physical vapor deposition, chemical vapor deposition, etc.

The gate dielectric 34 and gate electrode 36 may be formed by patterning a deposited layer stack of their constituent materials using photolithography and etching processes. To provide the patterning, a mask layer may be applied on a top surface of the layer stack and patterned with photolithography. The mask layer may comprise a photosensitive material, such as a photoresist, that is applied by spin coating, pre-baked, exposed to light projected through a photomask, baked after exposure, and developed with a chemical developer. A section of the mask layer covers the layer stack at the intended location of the gate electrode 36 and functions as an etch mask. An etching process is used, with the mask layer present, to form the gate dielectric 34 and the gate electrode 36 from the layer stack. The etching process may be selected to remove the materials of the layer stack selective to the respective materials of the fins 10, 12, 14 and contacts 24, 26. The etching process may be conducted in a single etching step or multiple steps, and may rely on one or more etch chemistries. The mask layer may be removed following the etching process. If comprised of a photoresist, the mask layer may be removed by ashing or solvent stripping, followed by a cleaning process.

A planarization process, such as chemical-mechanical polishing (CMP), is employed to planarize the top surfaces of the gate electrode 36 and the contacts 24, 26. The gate dielectric 34 is positioned between the gate electrode 36 and a channel in the fins 10, 12, 14, which is itself located between the source/drain regions 13. The spacers 30, 32, which flank the opposite sidewalls of the gate electrode 36, are positioned between the contacts 24, 26 and the gate electrode 36 as intervening structures. The gate electrode 36 is formed in a self-aligned manner with the channel as constrained by the presence of the contacts 24, 26 that are formed before the gate electrode 36 is formed. The contacts 24, 26 are not dummy structures comprised of a sacrificial material that is removed after the gate electrode 36 is formed and exist as elements in the final device structure 50.

The complexity of the processing method producing the device structure 50 is reduced in comparison with the complexity of fabricating conventional device structures. The device structure 50 has the form of a fin-type field effect transistor in which the physical gate length of the device structure 50 is determined by the contact-to-contact spacing between contacts 24, 26. Gate lithography is eliminated because the gate electrode 36 is formed between the contacts 24, 26 in a self-aligned manner. As a result, a positive lithographic step is not needed to establish the channel length of the device structure 50, which eliminates limitations of on the minimum gate length that is achievable in conventional device structures.

In the process flow of fabrication stages, the contacts 24, 26 are formed as metal pillars as an initial step and at earlier fabrication stage in the processing flow than in the fabrication of convention device structures. Another consequence of the process flow is that enabling technologies for low-temperature transistor formation, such as for three-dimensional monolithic integration (nanosecond laser anneal, etc.), may be utilized to form the field-effect transistor after the contacts 24, 26 are formed.

The contacts 24, 26 may provide improved contact metallurgy by eliminating protective liners (generally of lower conductivity) normally used to fill contact holes for prevent interaction of the metal deposition process. The elimination of the protective liners may be effective to reduce the contact resistance. In addition, the device structure 50 can be formed without a contact etch-stop layer on top of the gate electrode, and the contacts 24, 26 do not have to be etched selectively to maintain self-alignment.

Figure 4:
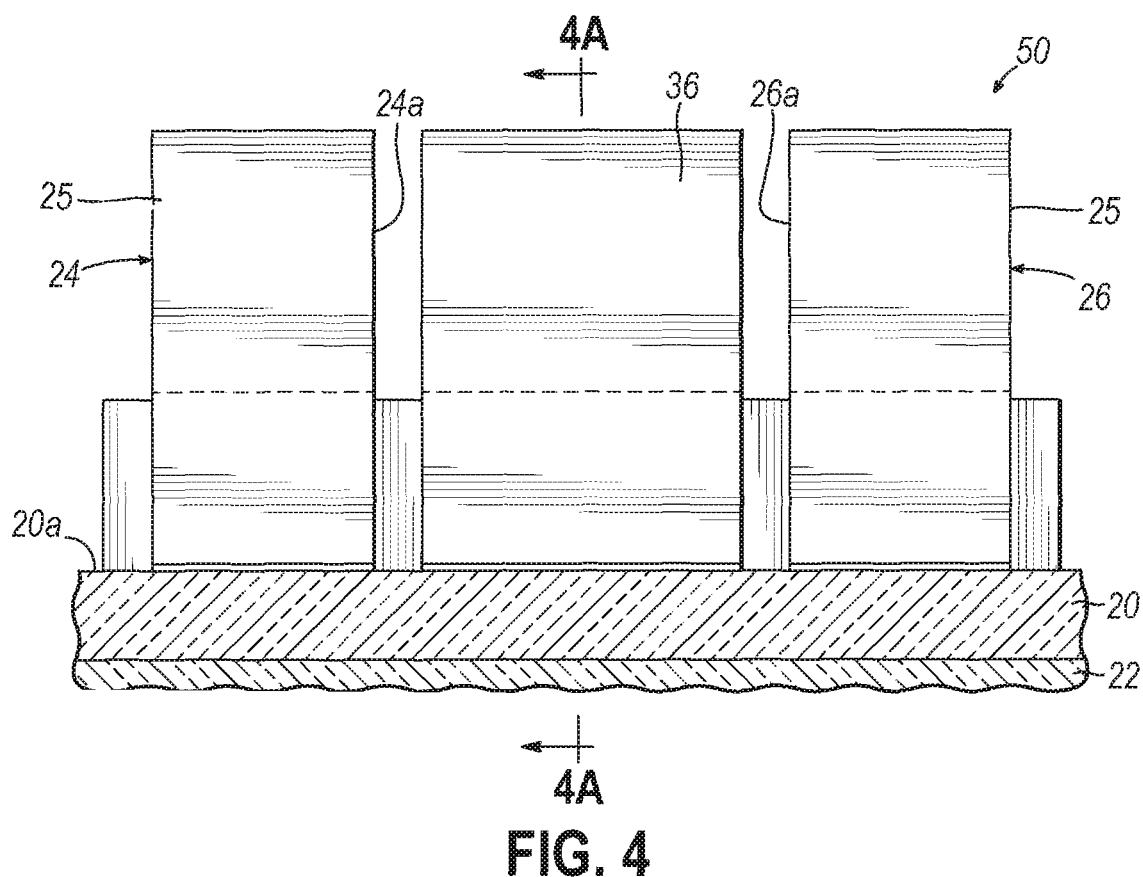
Figure 4A:
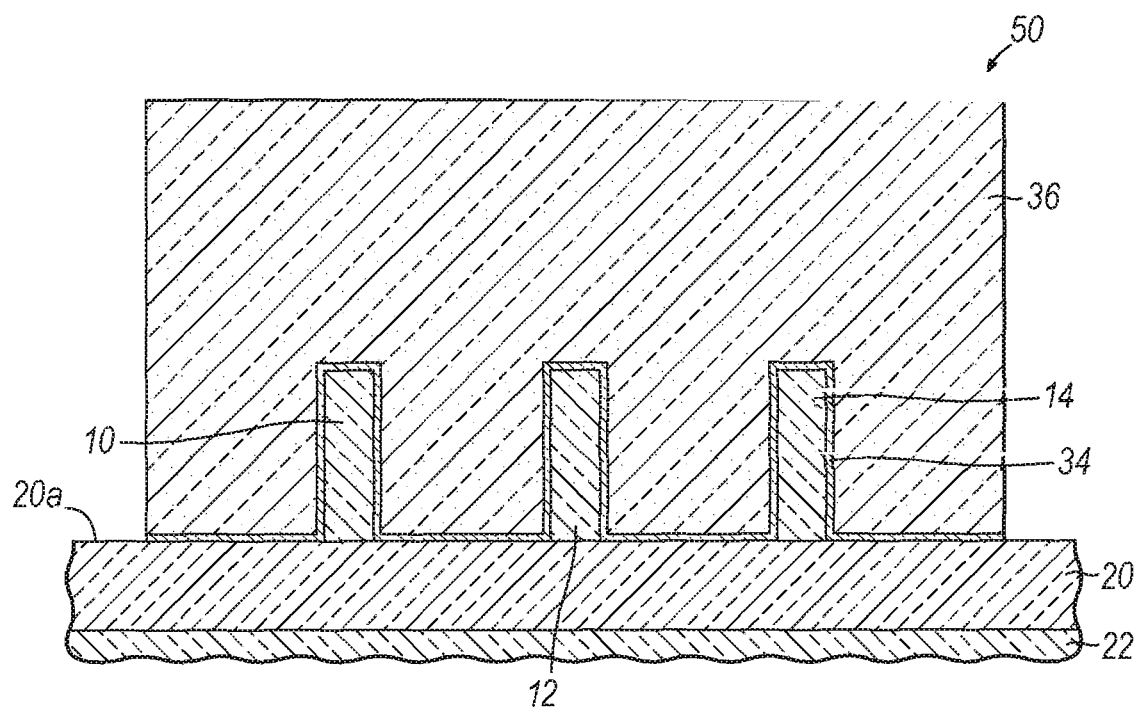
FIG. 4A is a cross-sectional view taken generally along line 4A-4A in FIG. 4.

With reference to FIGS. 4, 4A in which like reference numerals refer to like features in FIGS. 3, 3A and in accordance with an alternative embodiment, the spacers 30, 32 may be removed using an etching process that is selective to the materials of the contacts 24, 26 and the gate electrode 36. Once removed, the exterior surfaces 10a, 12a, 14a of the fins 10, 12, 14 between the side surfaces 24a, 26a of contacts 24, 26 and confronting side surfaces of the gate electrode 36 are exposed. Sections of the fins 10, 12, 14 are accessible to be doped by, for example, plasma immersion or ion implantation to define link-up extensions. The semiconductor material of the fins 10, 12, 14 may be doped by introducing a p-type dopant species selected from Group III of the Periodic Table (e.g., boron) that is effective to impart p-type conductivity. Alternatively, the semiconductor material of the fins 10, 12, 14 may be doped by introducing an electrically-active dopant, such as an n-type dopant from Group V of the Periodic Table (e.g., phosphorus (P) or arsenic (As)) that is effective to impart n-type conductivity.

The spacers 30, 32 may remain in the gaps between the contacts 24, 26 and the gate electrode 36. If not removed and replaced, then the spacers 30, 32 will be present in the device structure 50 following its fabrication. In an embodiment, the spacers 30, 32 may not be removed and replaced if dopant is outdiffused from the spacers 30, 32, as discussed herein above, to dope sections of the fins 10, 12, 14 and thereby provide the link-up extensions.

Figure 5:
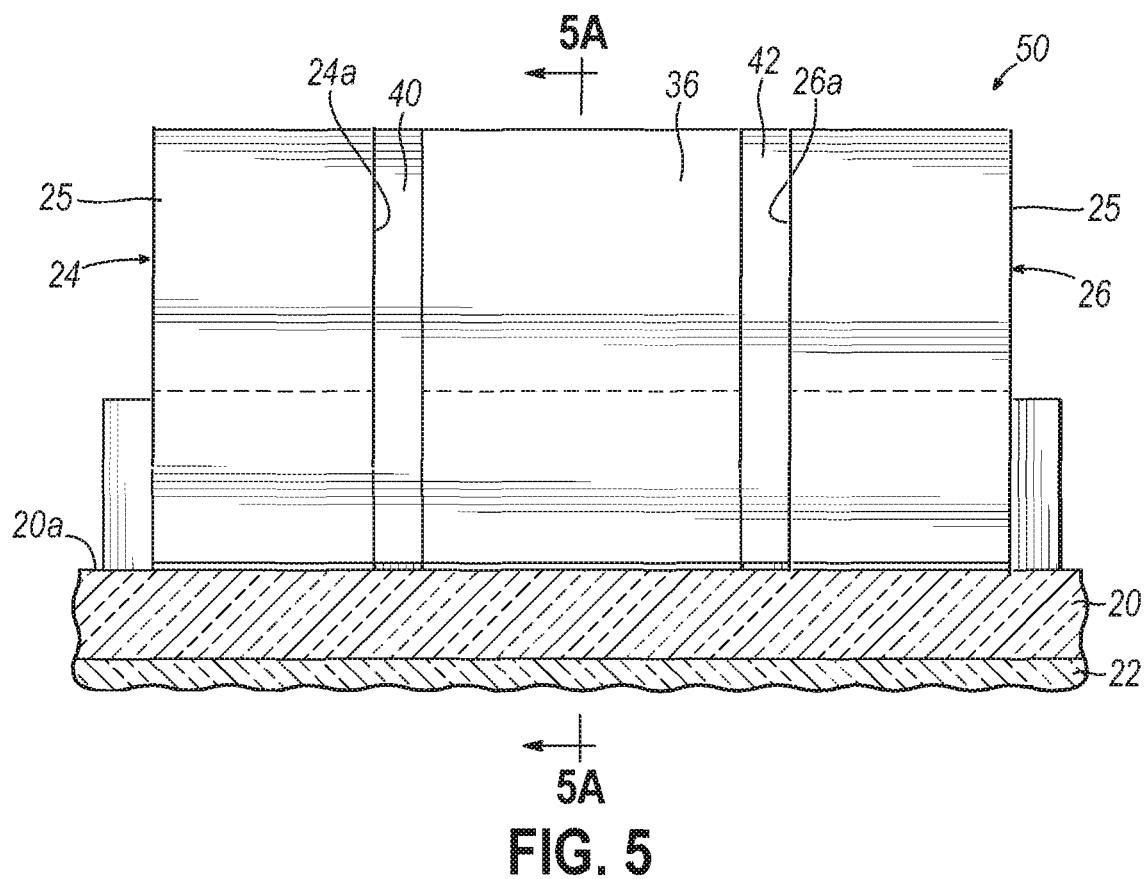
Figure 5A:
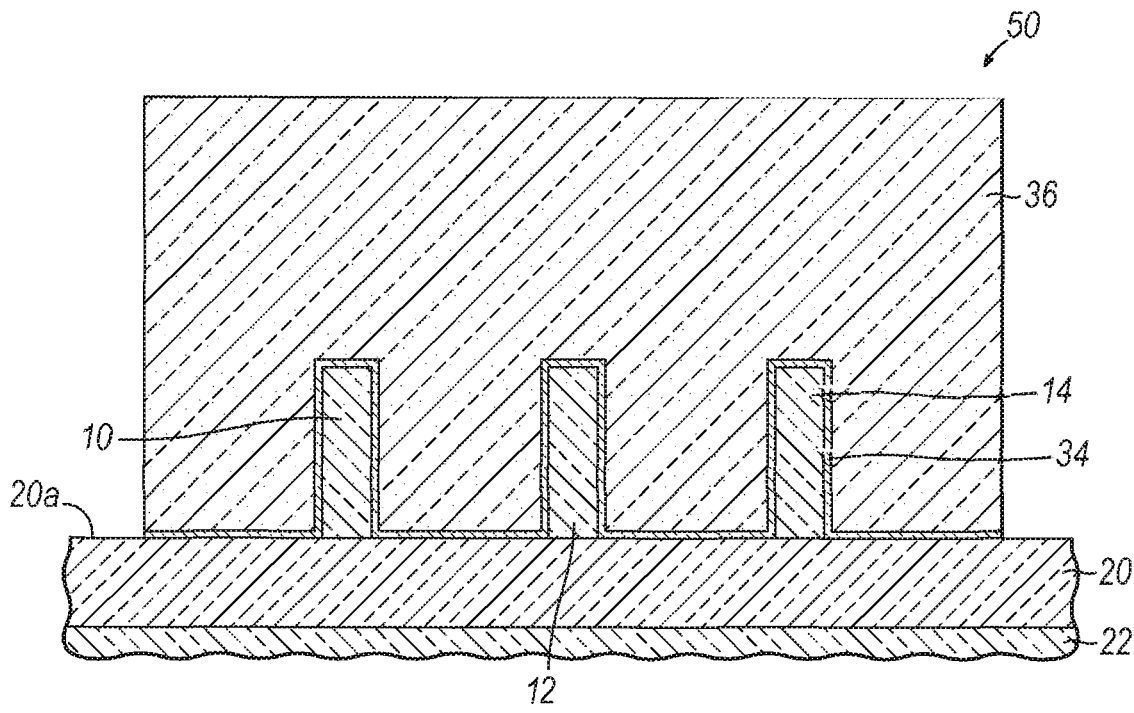
FIG. 5A is a cross-sectional view taken generally along line 5A-5A in FIG. 5.

With reference to FIGS. 5, 5A in which like reference numerals refer to like features in FIGS. 4, 4A and at a subsequent fabrication stage, spacers 40, 42 are formed inside the gaps between the contacts 24, 26 and gate electrode 36. The spacers 40, 42 may be formed from the same dielectric material (e.g., silicon nitride or silicon dioxide) as originally used in spacers 30, 32 or may be formed using a different dielectric material than original used in spacers 30, 32. In an embodiment, the spacers 40, 42 may be formed from a dielectric material having a lower relative permittivity or dielectric constant than the spacers 30, 32. For example, the spacers 40, 42 may be comprised of a low-k dielectric material characterized by a relative permittivity less than the relative permittivity for silicon dioxide of roughly 3.9. Candidate low-k dielectric materials for spacers 40, 42 include, but are not limited to, porous and nonporous spun-on inorganic and organic low-k dielectrics (e.g., hydrogen-enriched silicon oxycarbide (SiCOH)). Spacers 40, 42 may be deposited by any number of techniques including, but not limited to, sputtering, spin-on application, or chemical vapor deposition.

Figure 6:
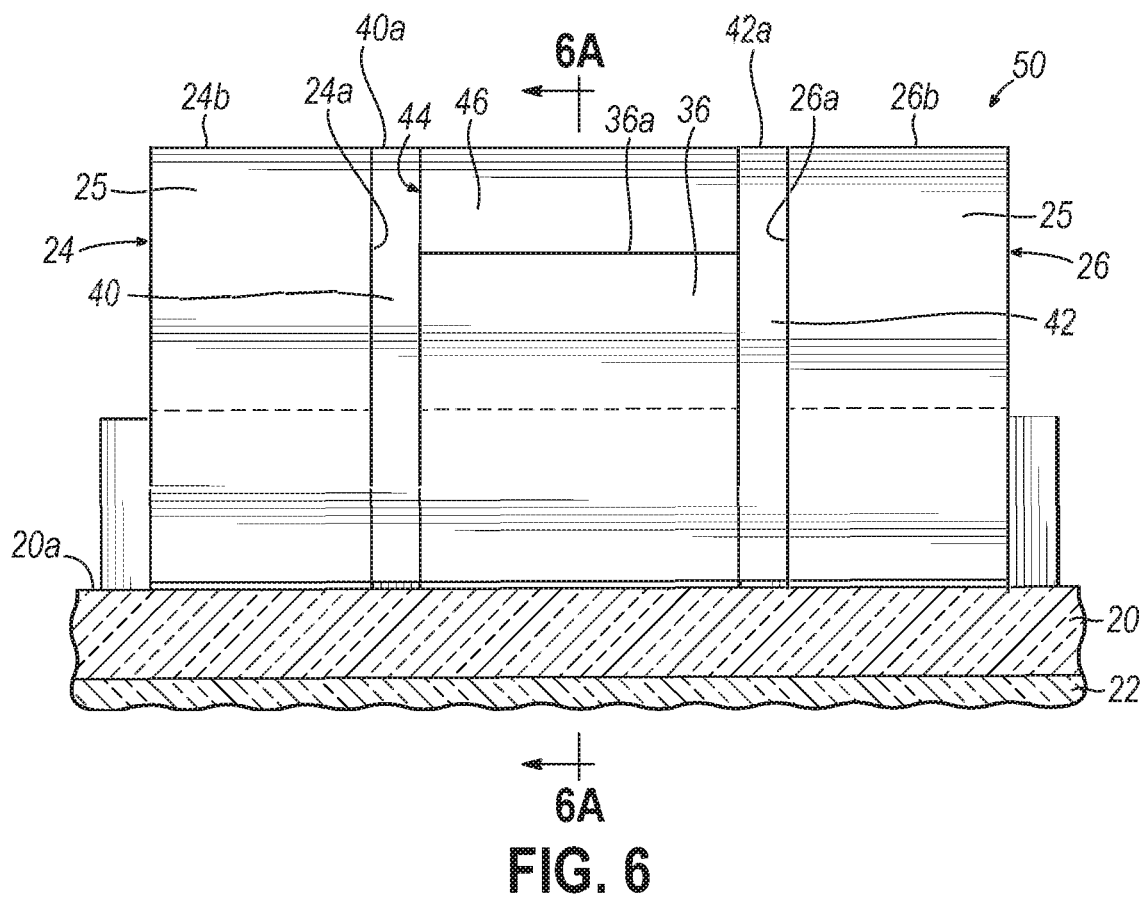
Figure 6A:
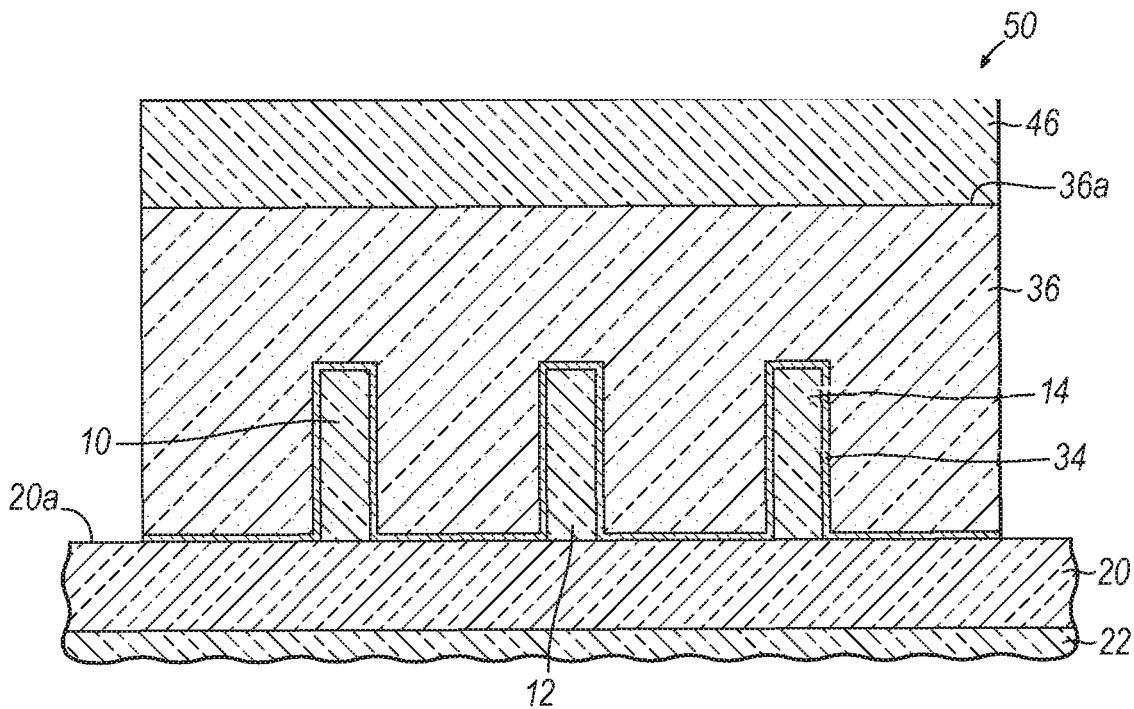
FIG. 6A is a cross-sectional view taken generally along line 6A-6A in FIG. 6.

With reference to FIGS. 6, 6A in which like reference numerals refer to like features in FIGS. 5, 5A and in accordance with an alternative embodiment, the top surface 36a of the gate electrode 36 may be recessed below a plane containing the top surfaces 40a, 42a of the spacers 40, 42 if the spacers 30, 32 are removed and replaced and a plane containing the top surfaces 24b, 26b of the contacts 24, 26 to define a cavity 44. An etching process may be used that removes the material of the gate electrode 36 selective to the materials of the spacers 40, 42 and contacts 24, 26. The etching process may be conducted in a single etching step or multiple steps, and may rely on one or more etch chemistries. If the spacers 30, 32 are not removed and replaced by spacers 40, 42, the top surfaces of the spacers 30, 32 may provide the reference plane for the recession of the gate electrode 36.

The cavity 44 may be filled with a dielectric layer 46 comprised of a dielectric material differing in composition from the conductive material comprising the gate electrode 36. In one embodiment, the cavity 44 may be filled during middle-of-line (MOL) processing. For example, during middle-of-line processing the cavity 44 may be filled during local interconnect formation with an electrical insulator, such as silicon dioxide ($SiO_2$), deposited by CVD and subsequently planarized using a chemical mechanical polishing process that eliminates topography. The replacement of a portion of the gate electrode 36 with dielectric material may be effective to reduce the capacitance of the device structure 50.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a device structure, the method comprising:
    forming a fin comprised of a semiconductor material;
    forming a first contact on the fin;
    forming a second contact on the fin and spaced along a length of the fin from the first contact;
    forming a self-aligned gate electrode on the fin that is positioned along the length of the fin between the first contact and the second contact; and
    for each contact on the fin:
        forming a dielectric spacer between the self-aligned gate electrode and the contact; and
        forming a source/drain region by doping a portion of the fin with dopant from the dielectric spacer.

2. The method of claim 1 further comprising:
    forming a first dielectric spacer between the first contact and the self-aligned gate electrode,
    wherein gate lithography is eliminated based on forming the self-aligned gate electrode between the first contact and the second contact via self-alignment.

3. The method of claim 2, further comprising:
    forming a second dielectric spacer between the second contact and the self-aligned gate electrode.

4. The method of claim 3, wherein the first dielectric spacer and the second dielectric spacer each include a dopant providing a solid-state diffusion source, and comprising:
    doping a first portion of the fin with the dopant from the first dielectric spacer to define a first source/drain region; and
    doping a second portion of the fin with the dopant from the second dielectric spacer to define a second source/drain region.

5. The method of claim 2, further comprising:
    removing the first dielectric spacer; and
    forming a second dielectric spacer between the first contact and the self-aligned gate electrode.

6. The method of claim 5, wherein the first dielectric spacer is comprised of a first dielectric material having a first relative permittivity, and the first dielectric spacer is comprised of a second dielectric material having a second relative permittivity less than the first relative permittivity.

7. The method of claim 1, wherein the first contact and the second contact each include a first layer comprised of a first material and a second layer comprised of a second material.

8. The method of claim 7, wherein the first material comprises a dopant providing a solid-state diffusion source, and comprising:
    doping a first portion of the fin with the dopant from the first material of the first contact to define a first source/drain region; and
    doping a second portion of the fin with the dopant from the first material of the second contact to define a second source/drain region.

9. The method of claim 1, wherein the first contact has a top surface, and the self-aligned gate electrode has a top surface that is recessed below the top surface of the self-aligned gate electrode to define a cavity between the first contact and the second contact.

10. The method of claim 9, further comprising:
    forming a dielectric layer in the cavity between the first contact and the second contact.

11. A method for forming a fin-type field effect transistor device structure, the method comprising:
    forming a fin comprised of a semiconductor material;
    forming a first contact that partially wraps around a first end of the fin;
    forming a second contact that partially wraps around a second end of the fin and spaced along a length of the fin from the first contact;
    forming a self-aligned gate electrode on the fin that is positioned along the length of the fin between the first contact and the second contact; and
    for each contact on the fin:
        forming a dielectric spacer between the self-aligned gate electrode and the contact; and
        forming a source/drain region by doping a portion of the fin with dopant from the dielectric spacer.

12. The method of claim 11, further comprising:
    forming a first dielectric spacer between the first contact and the self-aligned gate electrode,
    wherein gate lithography is eliminated based on forming the self-aligned gate electrode between the first contact and the second contact via self-alignment.

13. The method of claim 12, further comprising:
    forming a second dielectric spacer between the second contact and the self-aligned gate electrode.

14. The method of claim 13, wherein the first dielectric spacer and the second dielectric spacer each include a dopant providing a solid-state diffusion source, and comprising:
    doping a first portion of the fin with the dopant from the first dielectric spacer to define a first source/drain region; and
    doping a second portion of the fin with the dopant from the second dielectric spacer to define a second source/drain region.

15. The method of claim 12, further comprising:
removing the first dielectric spacer; and
forming a second dielectric spacer between the first contact and the self-aligned gate electrode.

16. The method of claim 15, wherein the first dielectric spacer is comprised of a first dielectric material having a first relative permittivity, and the first dielectric spacer is comprised of a second dielectric material having a second relative permittivity less than the first relative permittivity.

17. The method of claim 11, wherein the first contact and the second contact each include a first layer comprised of a first material and a second layer comprised of a second material.

18. The method of claim 17, wherein the first material comprises a dopant providing a solid-state diffusion source, and comprising:
doping a first portion of the fin with the dopant from the first material of the first contact to define a first source/drain region; and
doping a second portion of the fin with the dopant from the first material of the second contact to define a second source/drain region.

19. The method of claim 11, wherein the first contact has a top surface, and the self-aligned gate electrode has a top surface that is recessed below the top surface of the self-aligned gate electrode to define a cavity between the first contact and the second contact.

20. The method of claim 19, further comprising:
forming a dielectric layer in the cavity between the first contact and the second contact.

\* \* \* \* \*